United States Patent
Tagatac

(10) Patent No.: US 10,985,762 B2
(45) Date of Patent: Apr. 20, 2021

(54) COMPENSATING FOR FREQUENCY VARIATION OF A CRYSTAL OSCILLATOR AND RELATED SYSTEMS, METHODS AND DEVICES

(71) Applicant: Microchip Technology Incorporated, Chandler, AZ (US)

(72) Inventor: Arnel Tagatac, Lake Forest, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/240,357

(22) Filed: Jan. 4, 2019

(65) Prior Publication Data
US 2019/0379382 A1    Dec. 12, 2019

Related U.S. Application Data

(60) Provisional application No. 62/681,506, filed on Jun. 6, 2018.

(51) Int. Cl.
| H03L 1/02 | (2006.01) |
| H03B 5/30 | (2006.01) |
| H03B 5/04 | (2006.01) |

(52) U.S. Cl.
CPC .............. *H03L 1/023* (2013.01); *H03B 5/04* (2013.01); *H03B 5/30* (2013.01)

(58) Field of Classification Search
CPC ... H03L 1/02; H03L 1/023; H03L 1/26; H03L 1/028; H03B 5/04; H03B 5/30
See application file for complete search history.

(56) References Cited

U.S. PATENT DOCUMENTS

| 5,604,468 | A | 2/1997 | Gillig |
| 2004/0232997 | A1 | 11/2004 | Hein et al. |
| 2005/0285692 | A1* | 12/2005 | Mattila .................. H03L 1/026 331/175 |
| 2010/0315138 | A1* | 12/2010 | Namba .................. H03L 1/026 327/157 |
| 2016/0028405 | A1 | 1/2016 | Caffee et al. |
| 2018/0076819 | A1* | 3/2018 | Seethamraju ............ H03B 5/30 |

FOREIGN PATENT DOCUMENTS

WO        2006/000611 A1    1/2006

OTHER PUBLICATIONS

International Search Report for International Application No. PCT/US2019/033803, dated Sep. 4, 2019, 5 pages.
International Written Opinion for International Application No. PCT/US2019/033803, dated Sep. 4, 2019, 8 pages.

* cited by examiner

*Primary Examiner* — Jeffrey M Shin
(74) *Attorney, Agent, or Firm* — TraskBritt

(57) ABSTRACT

Systems, methods, and devices of the present disclosure relate, generally, to compensating for frequency error of a reference signal supplied to a clock-tracking-loop due to temperature. Error characteristics of a crystal oscillator that supplies the reference signal are used to compensate for possible frequency errors. Other systems, methods and devices are disclosed.

25 Claims, 13 Drawing Sheets

COMPENSATING FOR FREQUENCY VARIATION OF A CRYSTAL OSCILLATOR AND RELATED SYSTEMS, METHODS AND DEVICES

CROSS-REFERENCE TO RELATED APPLICATION

A claim for benefit of priority to the Jun. 6, 2018 filing date of U.S. Patent Provisional Application No. 62/681,506, titled "COMPENSATING FOR FREQUENCY VARIATION OF A CRYSTAL OSCILLATOR AND RELATED SYSTEMS, METHODS AND DEVICES" (the "'506 Provisional Application") is hereby made pursuant to 35 U.S.C. § 119(e). The entire disclosure of the 506 Provisional Application is hereby incorporated herein.

TECHNICAL FIELD

Embodiments of the disclosure relate, generally, to clock tracking loops such as phase-locked-loops (PLLs) and delay-lock-loops (DLLs), and, more specifically, some embodiments relate to addressing frequency variation of a crystal oscillator due to temperature.

BACKGROUND

One use for phase-locked-loops in wireless communication is to provide a local oscillator up-conversion during transmission and down-conversion during reception. Generally, in a phase locked loop (PLL), the phases of two input signals are compared, and an error signal is produced that is proportional to the difference between their phases. The error signal is low-pass filtered and used to drive a voltage-controlled oscillator (VCO) with an output signal frequency. The output signal frequency may be fed back through a frequency divider as one of the input signals, in other words, a negative feedback loop.

If one of the input signals is a reference signal (i.e., has a frequency that remains substantially constant), and the output signal's frequency drifts from the reference frequency, then the phase error signal will change (e.g., a higher amplitude of a voltage signal), which drives the frequency of the output signal in the opposite direction, reducing the phase difference and the phase error signal. So, the output signal's frequency becomes "locked" to the frequency of the reference signal.

A reference signal may be derived from a signal generated by a crystal oscillator, which generally has characteristics that provide a very stable frequency within certain temperature ranges. However, if a temperature goes outside the operating range of a crystal, then the crystal may begin to exhibit frequency variation, that is, the frequency that the crystal oscillates may vary from its standard or operational frequency (or a range of standard/operational frequency). The magnitude of variance is referred to as the frequency error.

Accordingly, the inventors of this disclosure see a need for techniques, systems, and devices to address the frequency variation of a crystal oscillator due to temperature.

DETAILED DESCRIPTION

Figure 1A:
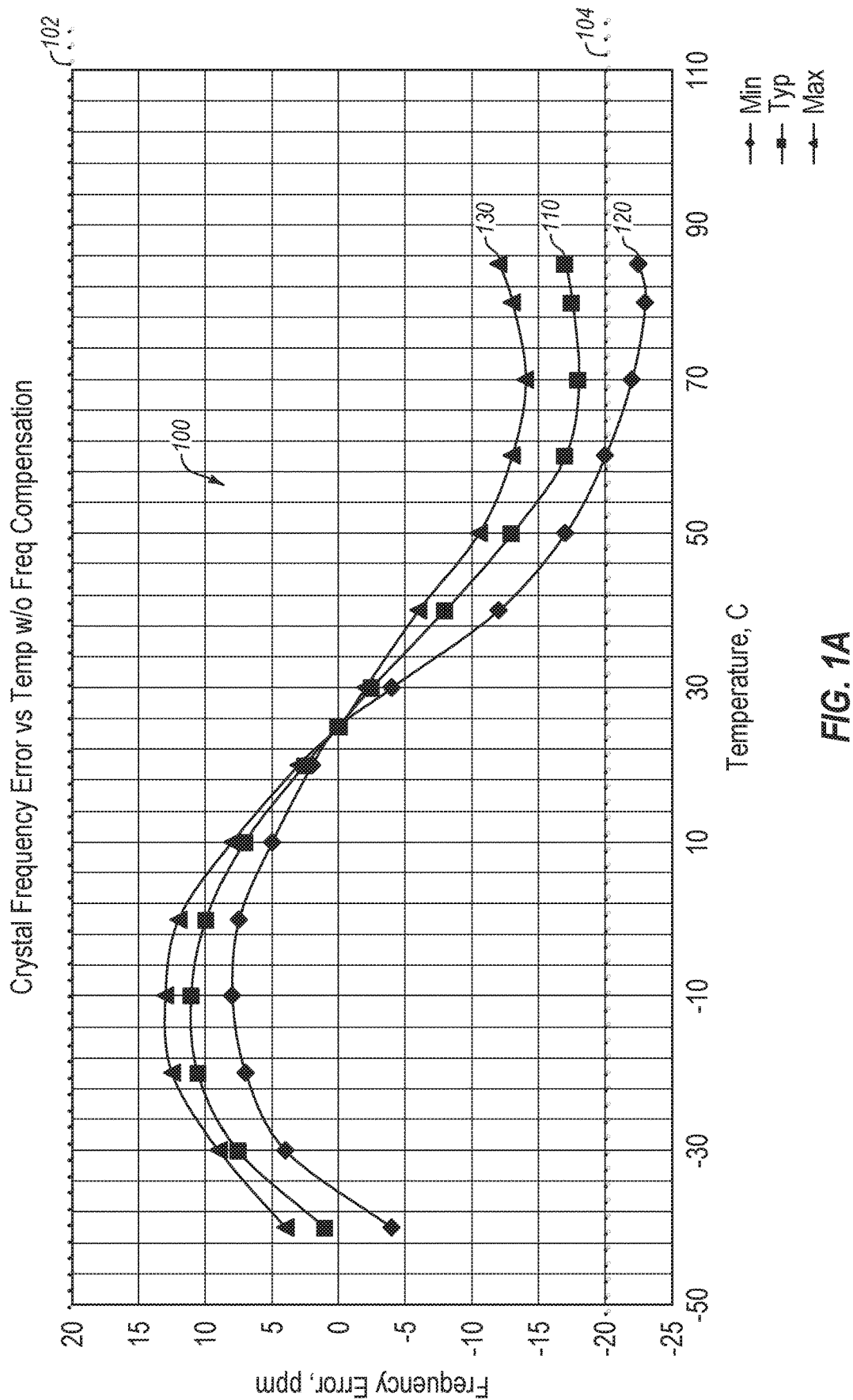
FIGS. 1A and 1B are graphs of frequency variation due to temperature for a typical crystal oscillator used for a reference signal in a phase locked loop.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer may be configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

FIG. 1A shows a graph of example test s-curves 100 of a crystal (abbreviated as "Xtal") of a crystal oscillator (abbreviated as "XO"). The s-curves 100 are the frequency error (expressed in parts-per-million or "PPM") as a function of temperature. Shown are three s-curves, a typical s-curve 110, a minimum (min) s-curve 120, and a maximum (max) s-curve 130. The typical s-curve 110 is the average part-to-part frequency error versus temperature of the example Xtal. The min s-curve 120 is the minimum part-to-part frequency error vs. temperature of the example Xtal. The max s-curve 130 is the maximum part-to-part frequency error vs. temperature of the example Xtal.

An acceptable error range for typical low-end wireless applications may be shown as a max frequency error 102 (about 20 ppm) and min frequency error 104 (about −20 ppm) over −40 to 85 degrees Celsius. Notably, the example test s-curves 100 are calibrated at room temperature. That is, during integration of a VCO (e.g., as a local oscillator used in wireless applications), it is frequency calibrated at room temperature (which, by convention, is about 23 degrees Celsius). Frequency calibration for an XO package (e.g., a module) adds cost and delays to integration.

Figure 1B:
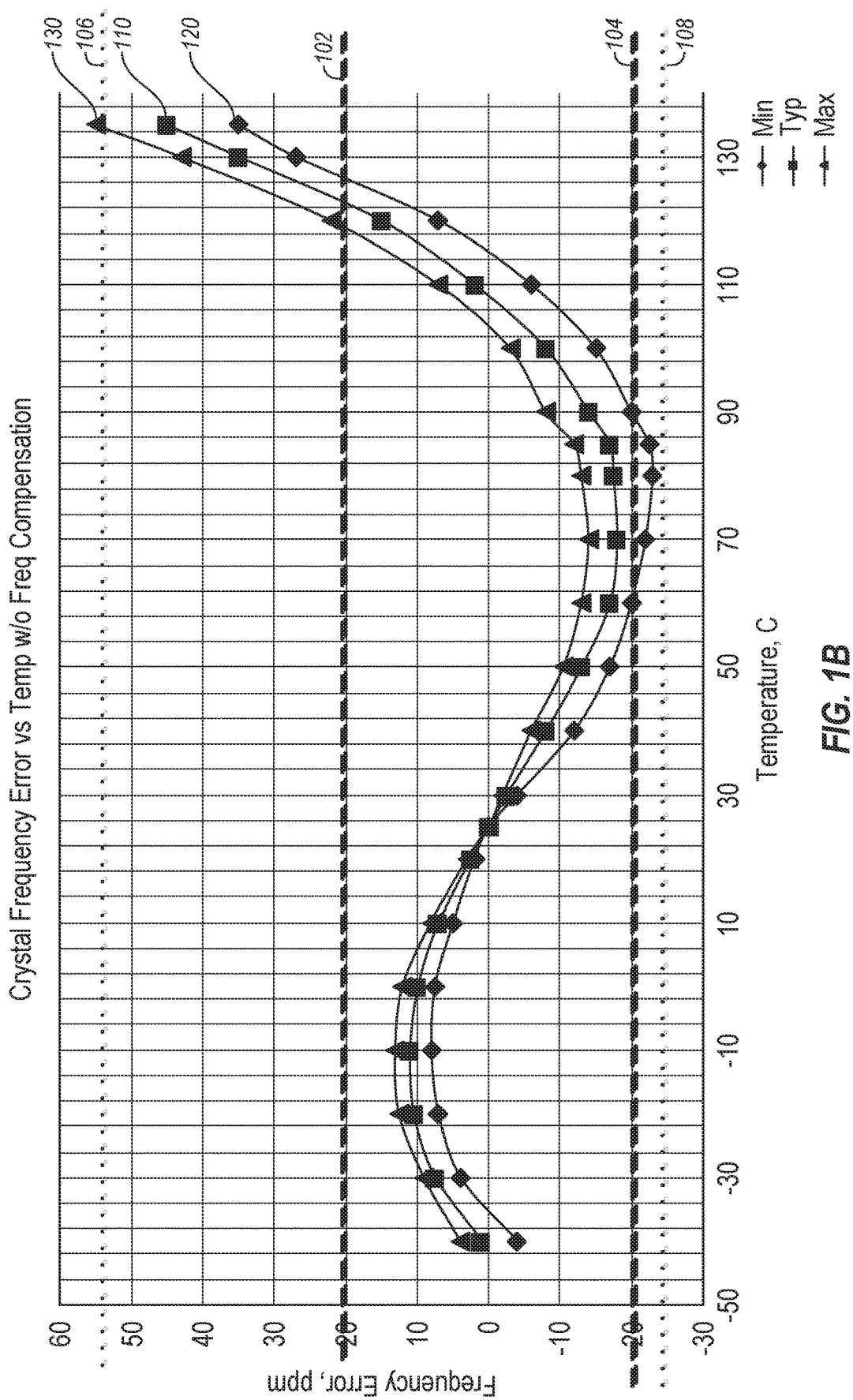

FIG. 1B shows the graph of example test s-curves 100 of FIG. 1A, extended out to 135 degrees Celsius. The acceptable error range for typical higher-end wireless applications is the same as low-end wireless applications, ±20 ppm, but over −40 to 135 degrees Celsius. The actual error range of the example Xtal between −40 to 135 degrees Celsius is shown as a max actual frequency error 106 (about 53 ppm) and a min actual frequency error 108 (about −23 ppm). So, at about 60 and 90 degrees Celsius the min s-curve 120 crosses the min frequency error 104, and at about 120 degrees Celsius the max s-curve 130 crosses the max frequency error 102. So, frequency calibration techniques that are otherwise acceptable for −40 to 85 degree range, alone, are not sufficient to compensate for wider temperature variation. The deficiency is due, at least in part, to the rate of increase of frequency error as the temperature increases. Turning back to FIG. 1B, for the example Xtal, as the temperature passes about 95 degrees Celsius, for every degree Celsius increase the rate of change of the frequency error increases and overwhelms any temperature compensation by mere calibration.

Some conventional PLL's known to the inventors of this disclosure incorporate an XO package with a higher quality crystal, that is, the crystal (and therefore the package) has greater frequency stability because it is manufactured with better precision and materials compared to other crystals.

Some conventional PLL's known to the inventors of this disclosure incorporate temperature compensated crystal oscillators (TCXO) that exhibit frequency stability (which may also be characterized as better accuracy versus temperature) over a wider temperature range as compared to a standard XO. In other cases, an XO package incorporates extra circuitry to achieve the temperature compensation. For example, a Voltage Controlled Crystal Oscillator (VCXO) is connected to a compensation circuit that senses the temperature and applies a small correction voltage to the VCXO, for example, by way of a varactor diode that "pulls" the frequency of the XO back into specification.

More precise crystal manufacture and/or compensation circuitry increases cost. Moreover, the conventional compensation circuitry is typically "hardwired"—either a specific response circuit tied to specific thermistors or as digital logic that derives a correction voltage based on temperatures from values or coefficients stored in a memory in the TXCO package. The inventors of this disclosure now understand that when the circuitry of a TCXO begins to age or otherwise degrade, the TCXO may begin to experience frequency shift. The hardwired compensation circuitry will not adjust to changing frequency shift due to aged hardware.

One embodiment of the disclosure relates, generally, to a process of compensating for frequency error associated with a reference clock provided by a crystal oscillator. The process involves configuring a programmable frequency divider in a feedback path of a phased-locked-loop (PLL) with one or more device parameters that are based on a frequency offset compensation (which may also be referred to as a "frequency offset compensation," "frequency variation compensation," a "frequency error compensation"). A compensation circuitry determines the frequency offset compensation responsive to a frequency error function associated with the crystal oscillator. The frequency error function is based on a frequency error as a function of the temperature of the crystal oscillator. In one embodiment, the frequency offset compensation is the inverse of a frequency error associated with a crystal for a given temperature.

Figure 2:
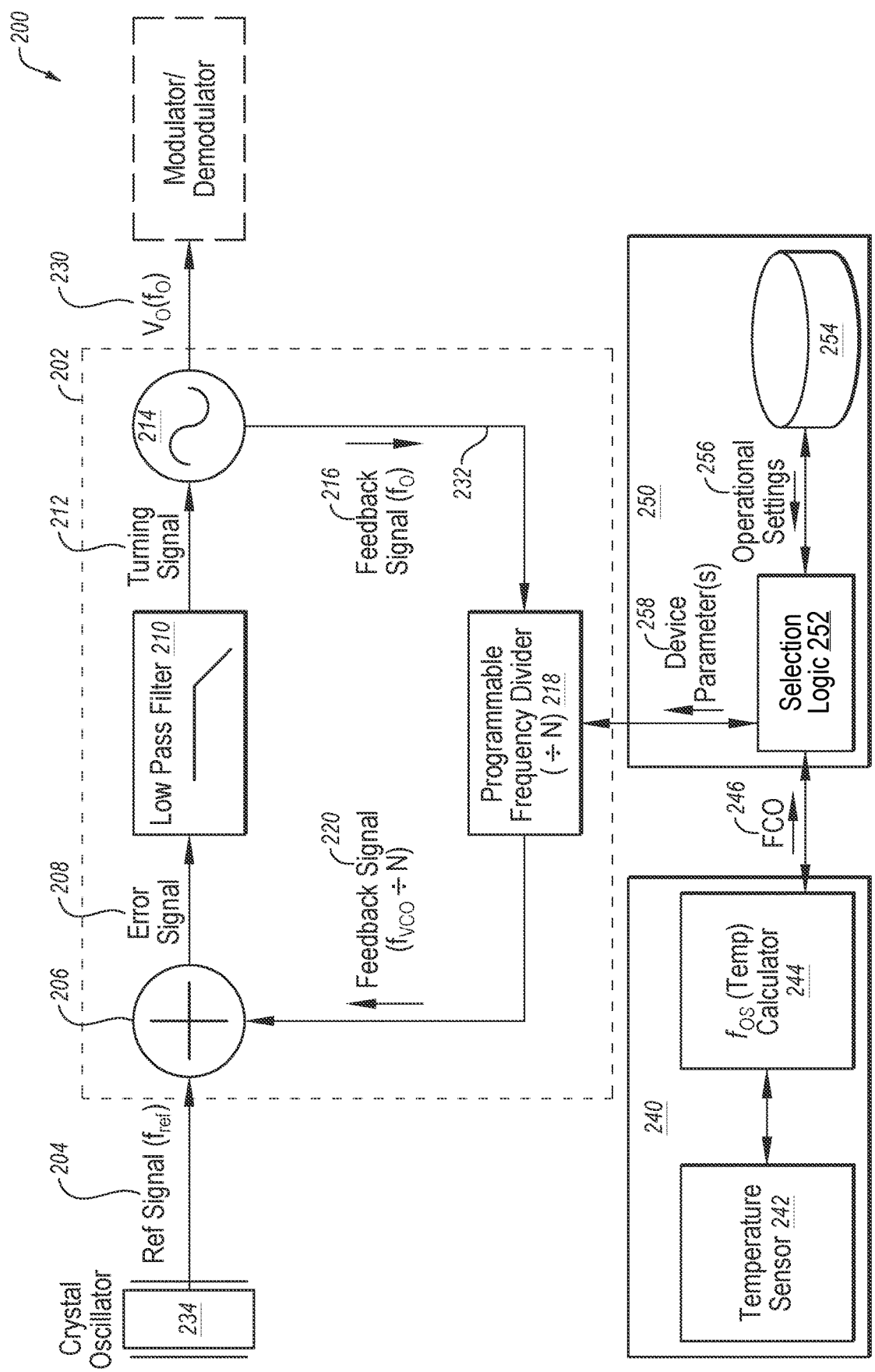
FIG. 2 is a block diagram of a phase-locked-loop including frequency variation compensation, according to an embodiment of the disclosure.

FIG. 2 shows a system 200 with a PLL (e.g., an integer-N PLL or fractional-N PLL) and circuitry to compensate for the frequency variation of a reference signal due to temperature, according to an embodiment of the disclosure. In one embodiment, PLL 202 includes a phase detector 206, a low-pass filter 210, a voltage controlled oscillator (VCO) 214, and a programmable frequency divider 218. The phase detector 206 receives a reference signal 204 with frequency $f_{ref}$ that is induced by, or based on a signal induced by, a crystal oscillator 234, and receives a divided feedback signal 220 with frequency $1/N*f_{vco}$ from programmable frequency divider 218. The phase detector 206 provides an error signal 208 that may be proportional to a phase difference between the reference signal 204 and divided feedback signal 220. The low-pass filter 210 low-pass filters the error signal 208, which removes high frequency elements of the error signal 208, and the low-pass filter 210 provides a tuning signal 212 (i.e., the filtered error signal 208) to the control terminals of the voltage controlled oscillator (VCO) 214. The voltage controlled oscillator (VCO) 214 receives the tuning signal 212 and provides an output signal (VO) 232 with a frequency $f_{vco}$ that is equal to $N*F_{ref}$.

In one embodiment, the phase detector 206 may be a digital phase detector configured to indicate one or more of phase error and frequency error. The error signal 208 output by the phase detector 206 may comprise digital pulses whose average voltage (and the tuning signal 212 after the low-pass filter) corresponds to a phase error and/or frequency error between the reference signal 204 and the VCO output signal 230.

A feedback signal 216 with frequency $f_O$ based on the VCO output signal 230 may be provided, via a feedback path, to the programmable frequency divider 218. The programmable frequency divider 218 receives the feedback signal 216 and an input N (fractional or integer) that corresponds to a device parameter 258 provided by selection logic 252. Programmable frequency divider 218 may be configured to divide the frequency $f_O$ of the feedback signal 216 responsive to the device parameter 258. The device parameter 258 may be based on a frequency offset compensation 246. In various embodiments, frequency offset compensation 246 may expressed in terms of frequency, phase, or combinations thereof. In one embodiment, the programmable frequency divider 218 may be configured to take an input signal of frequency $f_{in}$ and provide an output signal of frequency $f_{out}$, where the relationship of $f_{out}$ to $f_{in}$ is $f_{out}=f_{in}/N$, where N is an integer or fraction of an integer.

In one embodiment, the programmable frequency divider 218 may be an integer-N frequency divider, and for example, may implement a binary counter clocked by an input signal, a shift register network such as a Johnson counter, or a series of divide by 2 D-flip-flops. In another embodiment, the programmable frequency divider 218 may be a fractional-N frequency divider that implements a pulse swallow counter for a fraction/non-integer N divide that is, for example, configured to skip some pulse counts when a configured divide is not an integer. In yet another embodiment the programmable frequency divider 218 may be a delta-sigma fractional-N divider.

As noted above, by changing the value of input N of the programmable frequency divider 218, the voltage controlled oscillator (VCO) 214 is tunable across a frequency band of interest. In one embodiment, the frequency bands may correspond to a radio frequency transceiver. A control circuitry 250 may be configured to control the programmable frequency divider 218 according to one or more frequency bands of interest. In one embodiment, selection logic 252 may be configured to provide a device parameter 258 for N (or an analog signal by way of a digital-to-analog-converter or "DAC" that corresponds to the device parameter 256) to the programmable frequency divider 218. In one embodiment, the selection logic 252 may be configured to determine device parameters 258 for N responsive to a frequency band of interest (including over multiple frequency bands) and a frequency offset compensation 246. The selection logic 252 may include, or have access to, a data store of operational settings 254 of settings related to one or more frequency bands. In one embodiment, the operational settings 254 may be stored as one or more tables corresponding to one or more frequency bands, and each table may have operational settings (e.g., values for N) that correspond to frequencies within the frequency bands.

The selection logic 252 may be configured to make one or more adjustments to the operational settings 254 responsive to the frequency offset compensation 246. In one embodiment, the frequency offset compensation 246 is provided by compensation circuitry 240. The selection logic 252 may be configured to receive the frequency offset compensation 246 and the operational settings 254, and provide the device parameters 258. By way of example, assuming $N=(f_{vo} \div f_{xtal})$, if $f_{xtal}$ decreases, then increasing N is needed to maintain $f_{vo}$, so the selection logic 252 adjusts the device parameter(s) 258 to increase the divider N to compensate for the decrease in $f_{xtal}$. Similarly, if $f_{xtal}$ increases then decreasing N is needed to maintain $f_{vo}$, so the selection logic 252 adjusts the device parameter(s) 258 to decrease the divider N to compensate for the increase in $f_{xtal}$.

Compensation circuitry 240 may be configured to provide the frequency offset compensation 246. In one embodiment, the compensation circuitry 240 includes a frequency offset calculator 244 and a temperature sensor 242. The frequency offset calculator 244 may be configured to receive temperature values from the temperature sensor 242 and determine frequency offset compensation 246 responsive to the received temperature values. In one embodiment, the temperature sensor 242 may be a thermistor that may be configured to measure a device temperature. In some embodiments, the temperature sensor 242 may be configured to measure the crystal oscillator's temperature or the ambient temperature of the environment around the crystal oscillator. In another embodiment, the temperature sensor 242 may be system software that may be configured to retrieve temperature values for use by the frequency offset calculator 244, for example, from a thermistor that is part of an IC package. The frequency offset calculator 244 may be digital logic or system software that may be configured to determine a frequency offset compensation 246 responsive to a temperature.

In one embodiment, the frequency offset calculator 244 may include a temperature versus frequency offset look-up-table (LUT) (frequency offset is one type of frequency error) where temperature values are the key to the LUT. The LUT may be configured to provide a frequency offset responsive to a given temperature value. In one embodiment, the temperature versus frequency offset table LUT may be created responsive to the frequency accuracy characteristics (which may also be characterized herein as "frequency error characteristics") over temperature for the crystal of the crystal oscillator 234. The frequency offset calculator 244 may be configured to determine the frequency offset compensation 246 responsive to the received frequency offset.

In one embodiment, the compensation circuitry 240 may include a temperature adjustment LUT (not shown) configured to store temperature adjustments, and each temperature adjustment may correspond to one or more of the various divider settings that are stored in the data store of operational settings 254. In that case, the selection logic 252 may be configured to provide a desired frequency or divider setting to the frequency offset calculator 244 as one of the inputs for the LUT, and the LUT may be configured to return a frequency adjustment responsive to the temperature and the divider setting. The LUT provides the frequency offset compensation 246 to the selection logic 252, which adjusts the operational settings 256 responsive to the frequency offset compensation 246. The selection logic 252 provides the device parameter 258 to the programmable frequency divider 218 responsive to the adjusted operational settings.

In one embodiment, the compensation circuitry 240 may include multiple temperature adjustment LUTs, each corresponding to a different frequency spectrum, in this manner, for example, the compensation circuitry 240 may be configured for multiple transmission and reception protocols.

In another embodiment, the compensation circuitry 240 may be configured to use an s-curve fit-function for Xtal response versus temperature or "S-curve" instead of a LUT. In this embodiment, the S-curve fit-function is an equation that defines an s-curve of the Xtal.

In one embodiment, the compensation circuitry 240 and/or the control circuitry 250 may be part of an integrated circuit (IC) package, and the PLL 202 and crystal oscillator 234 may be a local oscillator circuit that is part of a transceiver. So, for example, the compensation circuitry 240 and/or the control circuitry 250 may be an analog circuit or a digital logic circuit, or may be software executed by a microprocessor of a microcontroller that is operatively coupled to a transceiver.

Notably, the example test s-curves 100 may be calibrated at room temperature. That is, during integration of a VCO (e.g., as a local oscillator used in wireless applications), it may be frequency calibrated at room temperature (which, by convention, is 23 degrees Celsius). This calibration process takes additional time and resources, which increases manufacturing cost.

Figure 3A:
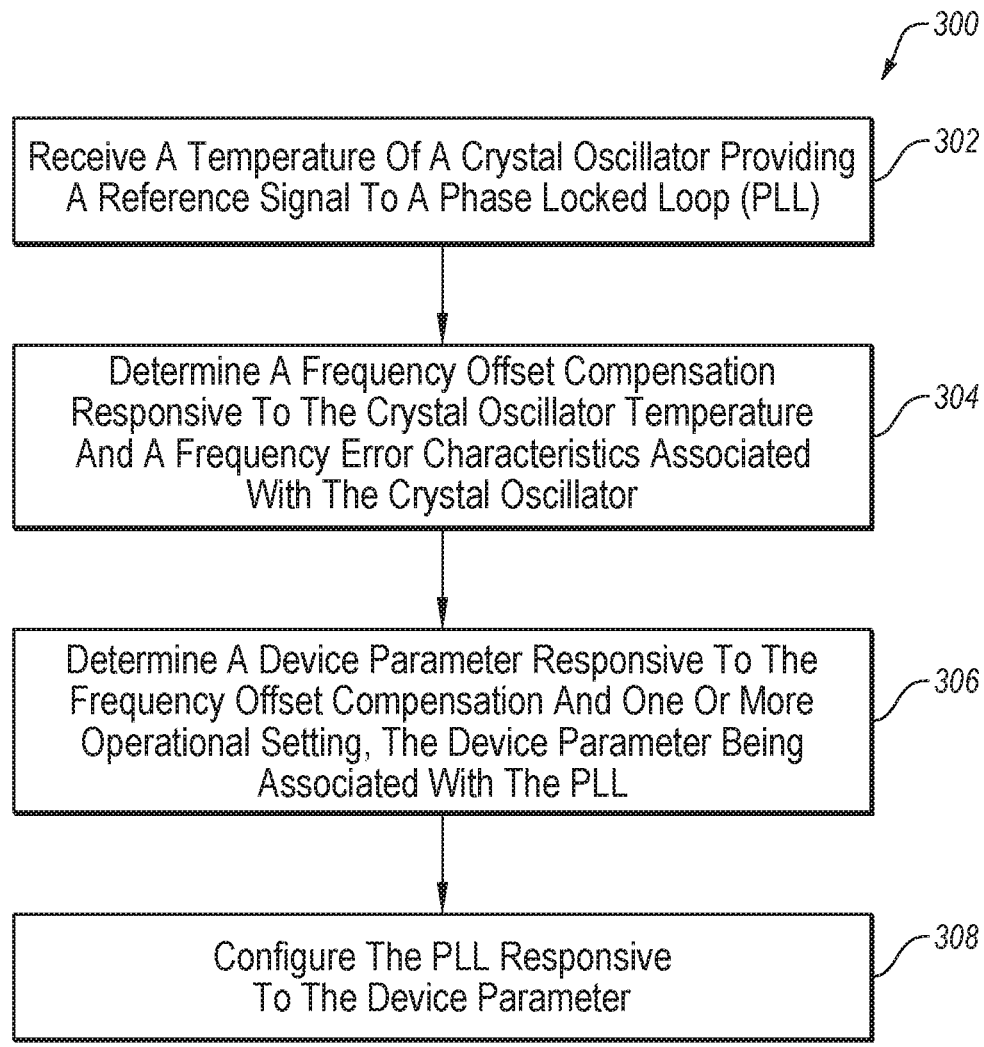
FIGS. 3A and 3B are flowcharts of processes for frequency error compensation, according to an embodiment of the disclosure.
Figure 3B:
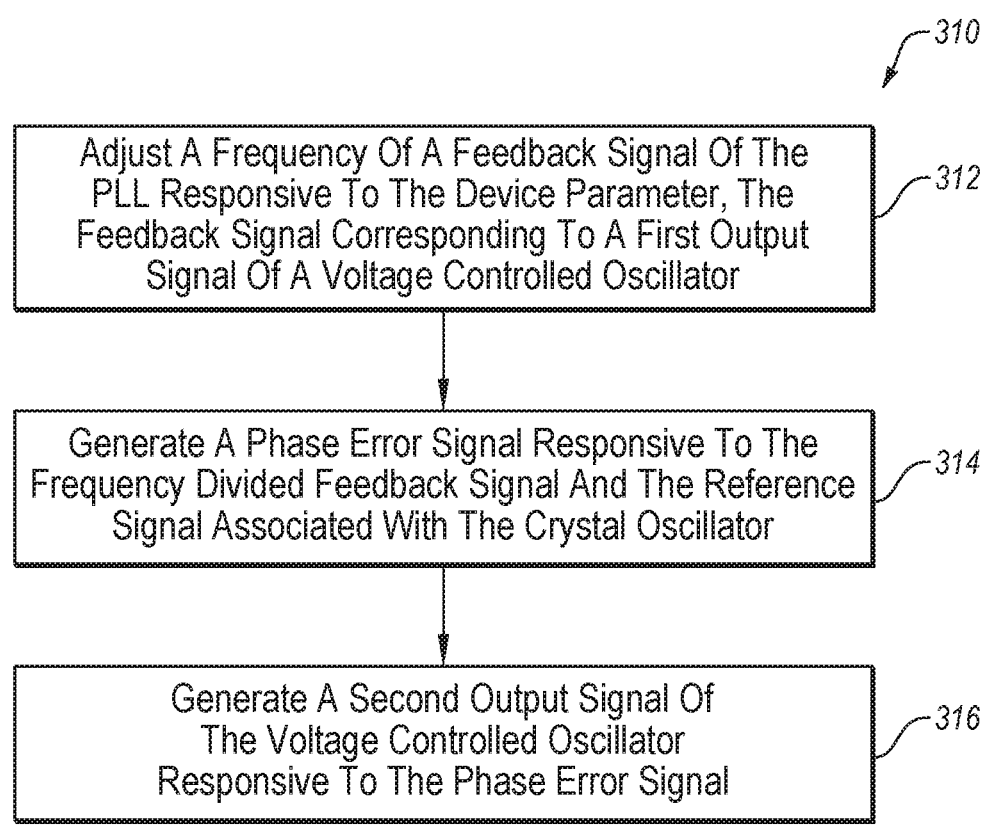

FIGS. 3A and 3B are flowcharts of a frequency error compensation processes (for example, for use with the system of FIG. 2), according to an embodiment of the disclosure. Turning to FIG. 3A, which shows a process 300 performed, for example, at a control module operatively coupled to a PLL, in operation 302, a temperature of crystal oscillator providing a reference signal to a PLL is received. In one embodiment, the temperature is based on, or responsive to, one or more temperature measurements (e.g., a current temperature, an average temperature, etc.) that are indicative of a temperature of the crystal oscillator. In operation 304, a frequency offset compensation is determined responsive to the temperature. The frequency offset compensation may be an inverse of a frequency error associated with crystal oscillator for one or more of the temperatures. In operation 306, a device parameter is determined responsive to the frequency offset compensation and one or more operational settings. The device parameter may be associated with the PLL, for example, associated with a frequency divider positioned in a feedback path of the PLL. In one embodiment, the operational settings may be associated with frequency or frequency bands of interest and the PLL. In operation 308, the PLL is configured responsive to the device parameter. In one embodiment, the device parameter is used to program a frequency divider in a feedback path of the PLL.

Turning to FIG. 3B, which shows a process 310 performed, for example, at a PLL, in operation 312, a frequency of a feedback signal of the PLL is adjusted by the programmed frequency divider, and so is adjusted responsive, at least in part, to the frequency offset compensation. The feedback signal corresponds to a first output signal of a voltage controlled oscillator. In operation 314, a phase error signal is generated responsive to the adjusted feedback signal and the reference signal supplied by the crystal oscillator. In operation 316, a second VCO output signal is generated responsive to the phase error signal.

In some cases, a measured temperature may not exactly match a temperature entry in a temperature versus frequency offset table or an adjustment table. So, one embodiment of the disclosures relates, generally, to interpolating a frequency offset compensation based, at least in part, on two temperature entries.

Figure 3C:
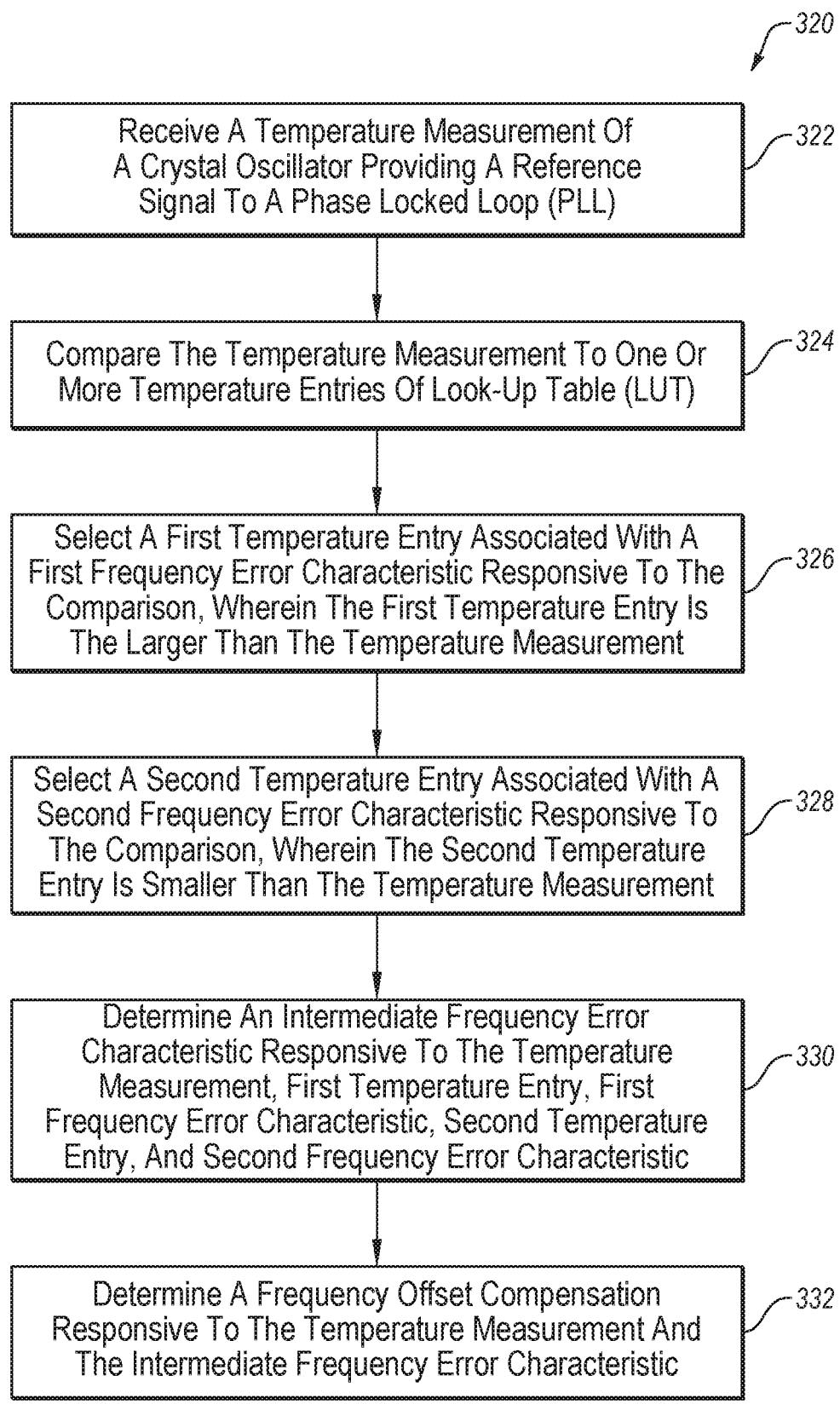
FIG. 3C is a flowchart of an interpolation process for determining frequency error compensation, according to an embodiment of the disclosure.

FIG. 3C is a flowchart of an interpolation process 320 for determining a frequency offset compensation, according to an embodiment of the disclosure. In operation 322, a temperature measurement is received that is associated with a crystal oscillator providing a reference signal to a PLL. In operation 324, the temperature measurement is compared to one or more temperature entries of a temperature versus frequency error LUT. In a contemplated process, none of the temperature entries match or are within an acceptable difference of the temperature measurement. In operation 326, a first temperature entry is selected responsive to the comparisons in operation 324. The first temperature entry is associated with a first frequency error characteristic of the crystal oscillator. The first temperature entry is greater (i.e., the value is greater) than the temperature measurement. In operation 328, a second temperature entry is selected responsive to the comparisons in operation 324. The second temperature entry is associated with a second frequency error characteristic of the crystal oscillator. The second temperature entry is smaller (i.e., the value is smaller) than the temperature measurement. In one embodiment, the first temperature entry may have the closest value to the temperature measurement of the temperature entries of the LUT that are greater than the temperature measurement, and the second temperature entry may be the closest value to the temperature measurement of the temperature entries of the LUT that are less then temperature measurement. In operation 330, an intermediate frequency error characteristic is determined responsive to the temperature measurement, first temperature entry, first frequency error characteristics, second temperature entry, and second frequency error characteristics. In one embodiment, the intermediate frequency error may be determined by performing an interpolation process using the first temperature entry, first frequency error characteristic, second temperature entry, and second frequency error characteristic. By way of example, piecewise interpolation, linear interpolation, polynomial interpolation, spline interpolation, a Gaussian process, or the like. While just two temperature are used here for east of description, one of ordinary skill in the art will understand that two or more temperature entries could be used for each of the first temperature entry and second temperature entry. In operation 332, a frequency offset compensation is determined responsive to the temperature measurement and the intermediate frequency error characteristics.

One embodiment of the disclosure relates, generally, to providing a frequency error compensation and a frequency error calibration to a programmable frequency divider located in the feedback path of a phase locked loop (PLL). The frequency error calibration is provided by a calibration circuitry, and performed according to a reference temperature, typically room temperature. The frequency error compensation is applied to calibrated device settings of the programmable frequency divider.

In one embodiment, a PLL may be calibrated for temperature related compensation when the crystal oscillator is integrated with VCO circuitry. The calibrated system may be temperature compensated during operation.

Figure 4:
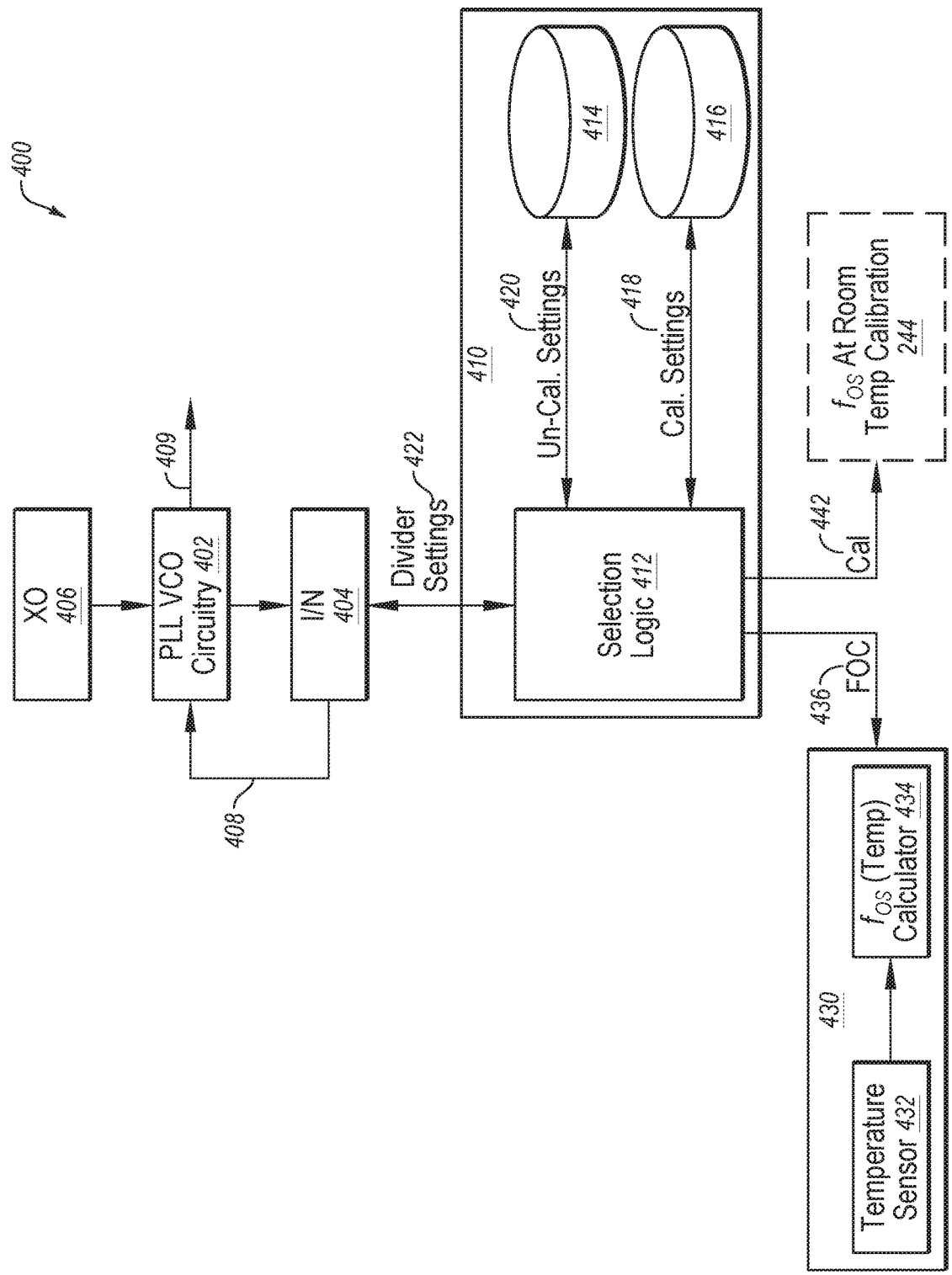
FIG. 4 is a block diagram of a phase-locked-loop including frequency variation compensation and calibration, according to an embodiment of the disclosure.

FIG. 4 shows a system 400 with temperature compensated PLL. Frequency compensation circuitry 430 is configured to calibrate for temperature, and temperature calibration circuitry configured to compensate for the frequency variation of a reference signal due to temperature, according to an embodiment of the disclosure. In FIG. 4, the only PLL elements shown are PLL VCO circuitry 402, 1/N divider 404, and crystal oscillator (XO) 406, in order to simplify the description, but it may include any suitable elements for a PLL, including those shown in FIG. 2.

Temperature calibration circuitry 440 may be configured to perform calibration at integration of crystal oscillator (XO) 406 to compensate for the crystal's frequency variation at room temperature, age of the crystal, and/or differences between crystals. In one embodiment, frequency calibration at production involves, generally: (i) turning on a device (e.g., a radio) that includes a system 400 with temperature compensated PLL and programming it to transmit to a known output signal having a known frequency responsive to a test device setting; (ii) providing an output of the device to test equipment that determines the frequency error, if any, of the device (e.g., comparing the actual output to the known, error-free, output); (iii) the frequency error determined by the test equipment is provided to a firmware application (e.g., executing at the device, the test equipment, or another device); and (iv) a frequency correction is determined responsive to the frequency error. The frequency correction may be provided to a data store such as the calibrated operational settings 416, which, in one embodiment, may be a memory location that may be read by a host, for example, a microcontroller unit (MCU) configured to program a PLL N-divider. The data store of calibrated operational settings 416 maybe adjusted operational settings associated with the PLL.

Following calibration, the control unit 410 and, more specifically, the selection logic 412 has access to, and may use, stored calibrated operational settings 416. In one embodiment, the stored calibrated operational settings 416 may be the frequency corrections determined responsive to a calibration process of the present disclosure. In another embodiment, the stored calibrated operational settings 416 may be value of N that have been adjusted responsive to the frequency corrections determined responsive to a calibration process of the present disclosure.

Selection logic 412 may be configured to receive calibrated operational settings 418 and frequency offset compensations (FOC) 436, and provide divider settings 422. In one embodiment, the selection logic 412 may be configured to adjust a calibrated operational setting 418 responsive to a FOC 436, and provide a divider setting 422 responsive to the adjusted calibrated setting. The frequency compensation circuitry 430 includes temperature sensor 432 and frequency error calculator 434, which may be configured the same as the compensation circuitry 240 (FIG. 2).

In one embodiment, similar to other compensation circuitry of the present disclosure, frequency compensation circuitry 430 may include a temperature adjustment LUT configured to store temperature adjustments. The temperature adjustments may be based on frequency accuracy characteristics over temperature for the crystal of crystal oscillator (XO) 406. The LUT may be configured to provide the frequency offset compensation responsive to temperatures or divider settings and temperatures. In another embodiment, the frequency compensation circuitry 430 may be configured to use an s-curve fit-function for Xtal response versus temperature or "S-curve" instead of a LUT. In this embodiment, the S-curve fit-function is an equation that defines an s-curve of the Xtal.

Figure 5A:
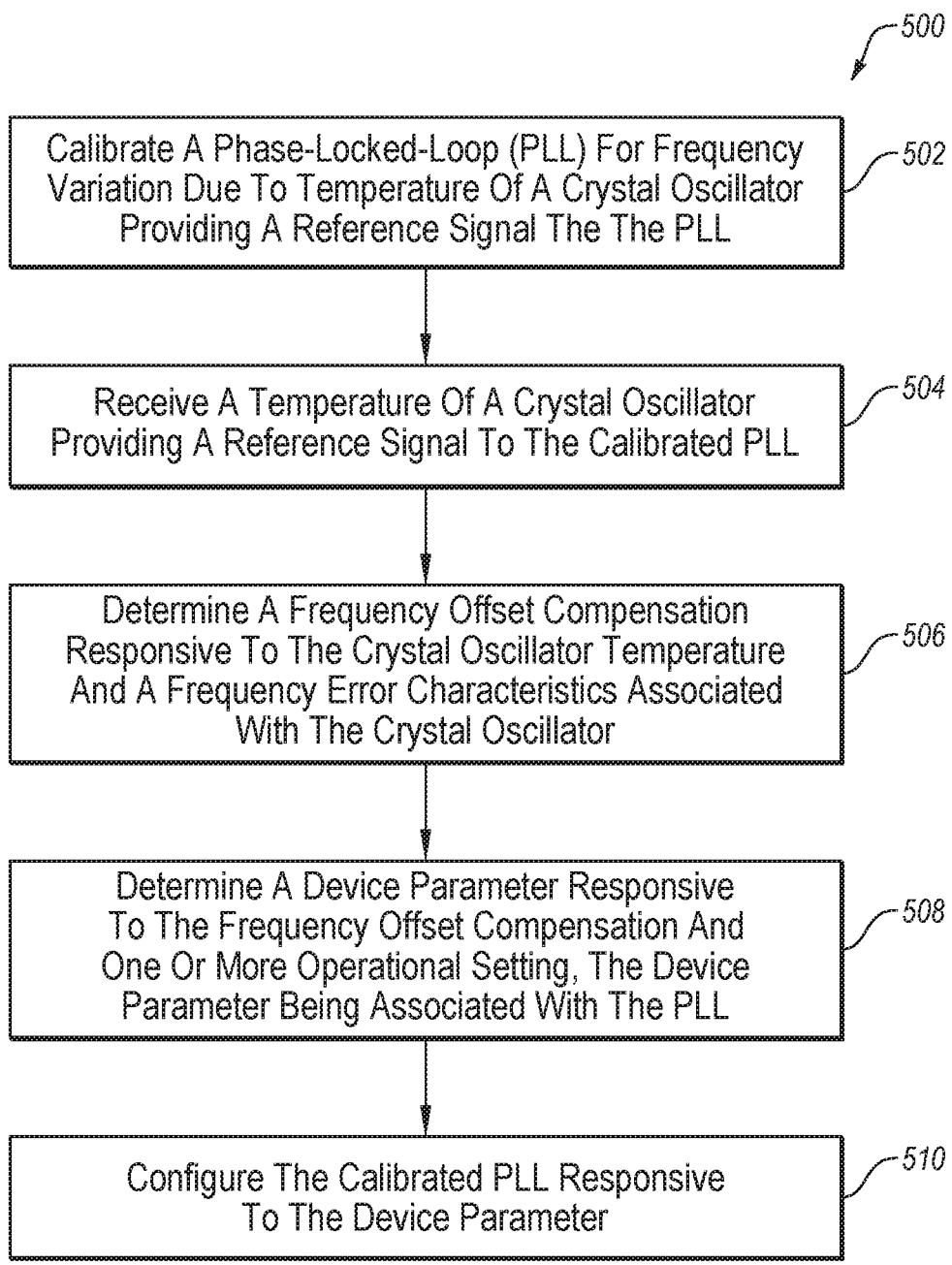
FIGS. 5A and 5B are flowcharts of processes for frequency variation compensation and calibration, according to an embodiment of the disclosure.
Figure 5B:
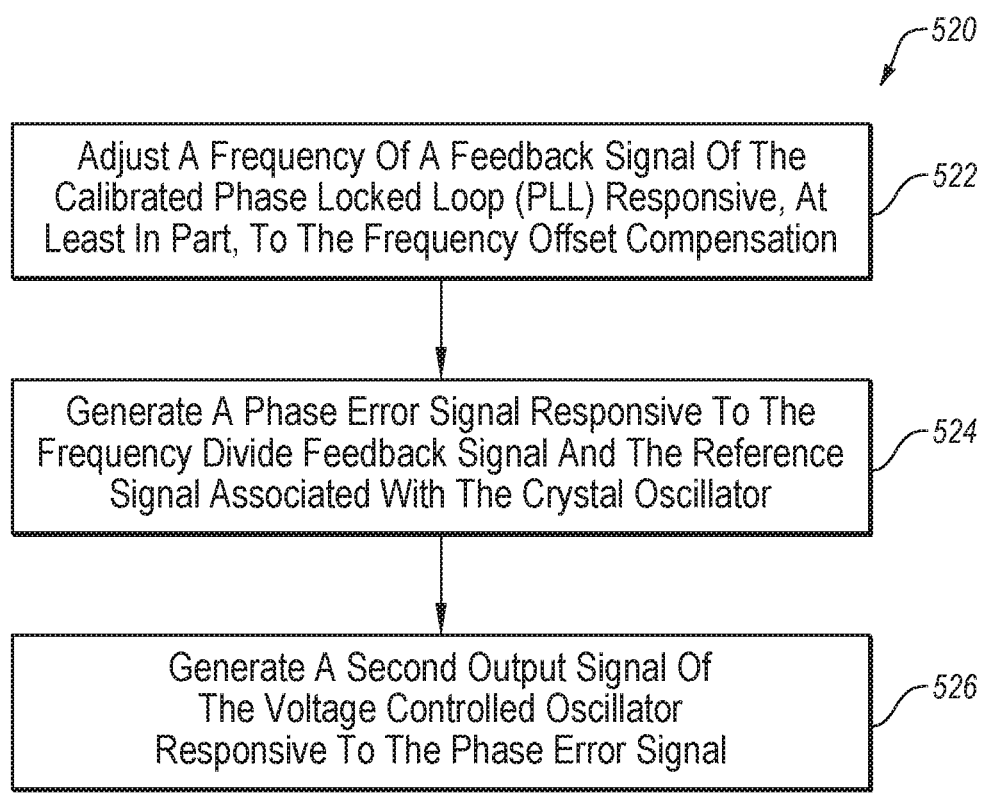

FIGS. 5A and 5B are flowcharts of frequency error calibration and compensation processes for a PLL, according to an embodiment of the disclosure. Turning to FIG. 5A, which shows a process 500 performed, for example, at control circuitry operably coupled to a PLL, in operation

502, a PLL is calibrated (e.g., using one or more calibration techniques of the present disclosure) for frequency variation of a crystal oscillator providing a reference signal to the PLL due to temperature. In operation 504, a temperature of the crystal oscillator is received. In one embodiment, the temperature is based on, or responsive to, one or more temperature measurements that are indicative of a temperature of the crystal oscillator. In operation 506, a frequency offset compensation is determined responsive to the temperature and a frequency error of the crystal oscillator associated with the temperature. In operation 508, device parameters are determined responsive to the frequency offset compensation and one or more operational settings. The operational settings may be associated with frequencies or frequency bands of interest and the PLL, moreover, the operational settings may be based on the results of the calibration process in operation 502. In operation 510, the PLL is configured responsive to the device parameters, for example, by programming a frequency divider.

Turning to FIG. 5B, which shows a process 520 performed, for example, at a PLL, in operation 522, a frequency of a feedback signal of the PLL is adjusted by the programmed frequency divider responsive, at least in part, to the device parameter, and so adjust, at least in part, responsive to the frequency offset compensation. The feedback signal corresponds to an output signal of a voltage controlled oscillator. In operation 524, a phase error signal is generated responsive to the adjusted feedback signal and the reference signal supplied by the crystal oscillator. In operation 526, a second output signal of a voltage controlled oscillator is generated responsive to the phase error signal.

Figure 6:
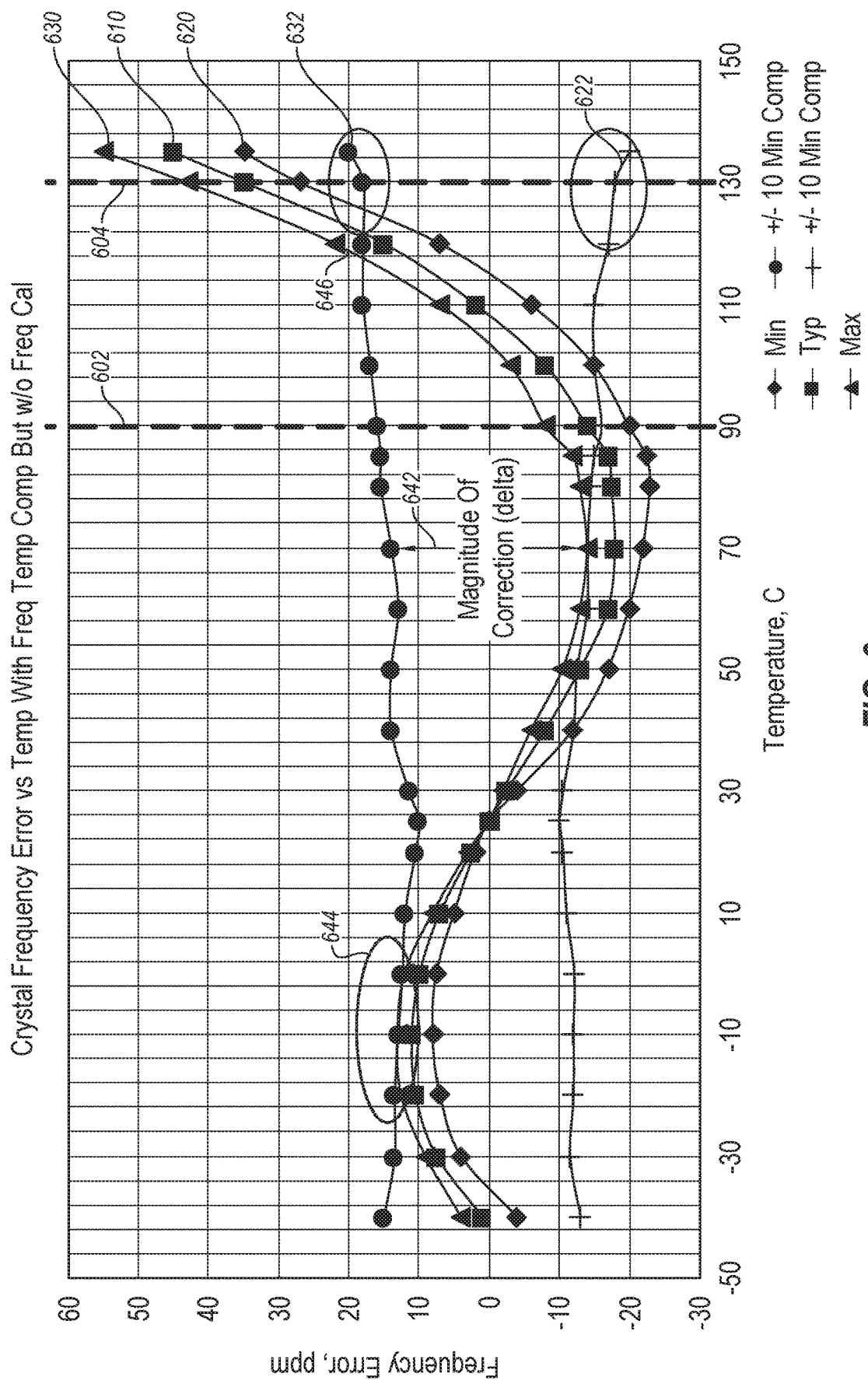
FIG. 6 is a graph of frequency variation due to temperature for a crystal oscillator used for a reference signal in a phase locked loop without frequency calibration after temperature compensation, according to an embodiment of the disclosure.

FIG. 6 shows a graph of an example test s-curves 600 of an example Xtal in a PLL without frequency compensation after temperature compensation according to an embodiment of the disclosure. The test s-curves 600 include a min s-curve 620, a typical s-curve 610 and a max s-curve 630. These three s-curves correspond to the s-curves of FIG. 1B, and only involve frequency calibration. Additional s-curves are shown, max s-curve 632 and min s-curve 622, that show the frequency error when frequency variation is corrected using a frequency compensation circuitry according embodiments of the disclosure. For −45 to 85 degrees Celsius, the s-curves 622 and 632 stay within ±20 ppm. A magnitude of correction 642 is identified at about 70 degrees Celsius that corresponds to the greatest degree of compensation exerted by the compensation circuitry. Notably, from about −25 to −15 degrees Celsius and at about 120 degrees Celsius, max s-curve 630 and compensated max s-curve 632 overlap, indicating ranges 644 and 646, where no (or negligible) compensation is exerted by the compensation circuitry. In one embodiment, ranges 644 and 646 correspond to a normal operational mode of the PLL and other temperature ranges correspond to temperature compensated ranges. Moreover, the min compensated s-curve actually has greater frequency error than the min s-curve 620 from about −45 degrees Celsius to 40 degrees Celsius.

Notably, at about 130 degrees Celsius the min and max s-curves 622 and 632, respectively, begin to approach the frequency error limit min and max of ±20 ppm, and begin to cross the limits at about 135 degrees Celsius.

Figure 7:
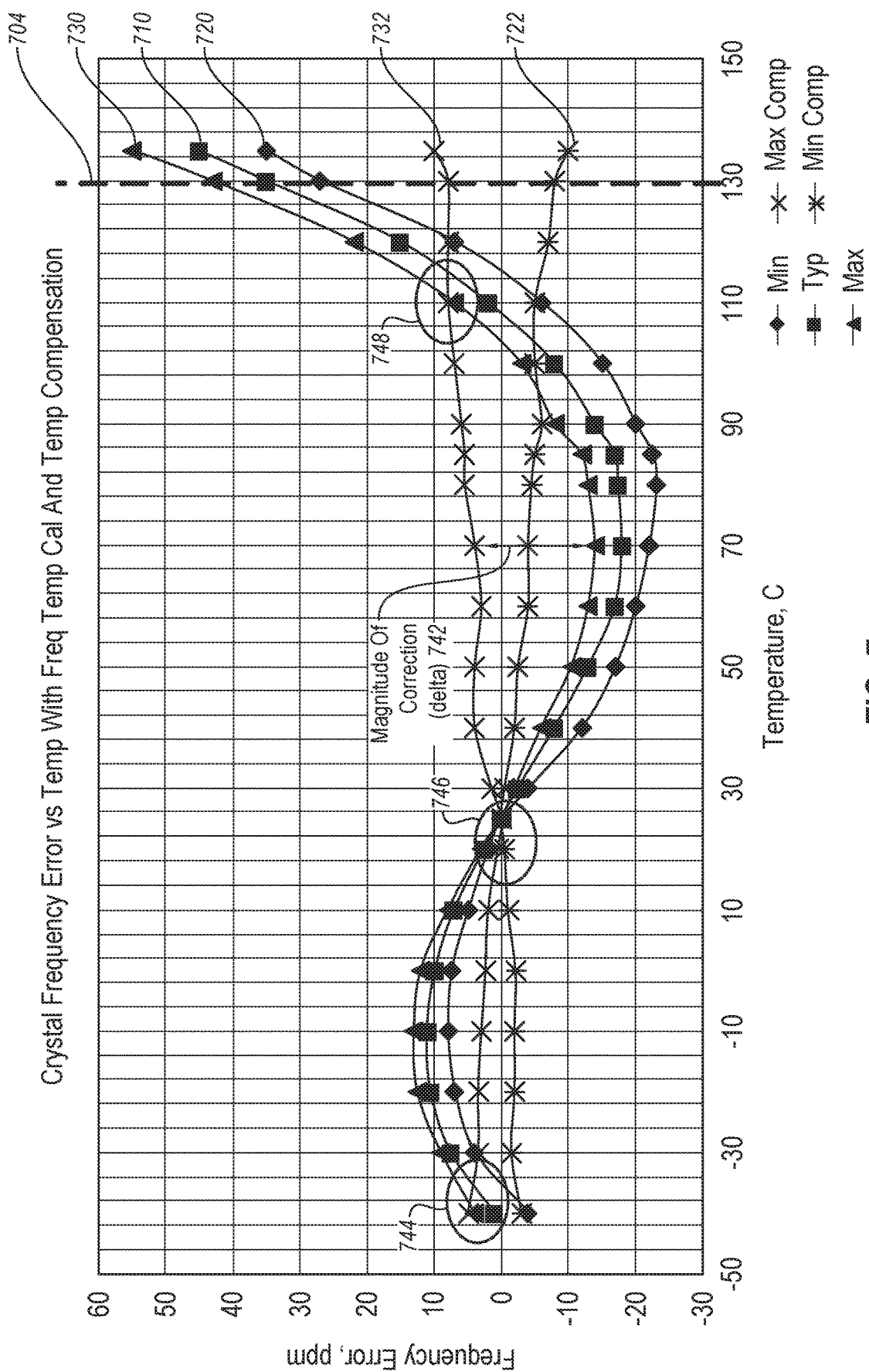
FIG. 7 is a graph of frequency variation due to temperature for a crystal oscillator used for a reference signal in a phase locked loop with frequency calibration and temperature compensation, according to an embodiment of the disclosure.

As noted, above, frequency error compensation may be used with a temperature calibrated PLL to improve frequency error and further widen the temperature range. FIG. 7 shows a graph of frequency variation due to temperature for a crystal oscillator used for a reference signal in a phase locked loop with frequency calibration and temperature compensation, according to an embodiment of the disclosure. FIG. 7 shows s-curves 700 for an example Xtal. S-curves 700 includes the typical, minimum and maximum s-curves without temperature compensation, 710, 720, and 730, respectively, min and max s-curves 722 and 732 with temperature compensation. With reference to the max s-curve 732, there is no temperature compensation at about −30 degrees Celsius (744), 25 degrees Celsius (746), and 110 degrees Celsius (748). There is temperature compensation (or temperature compensation is enabled) from −45 degrees Celsius to 135 degrees Celsius, except for the temperatures at 744, 746 and 748, noted above.

One of ordinary skill in the art will recognize many applications for embodiments of the disclosure. One embodiment of the disclosure relates, generally, to a transceiver that includes a local oscillator with frequency variation compensation according to embodiments of the disclosure.

Figure 8:
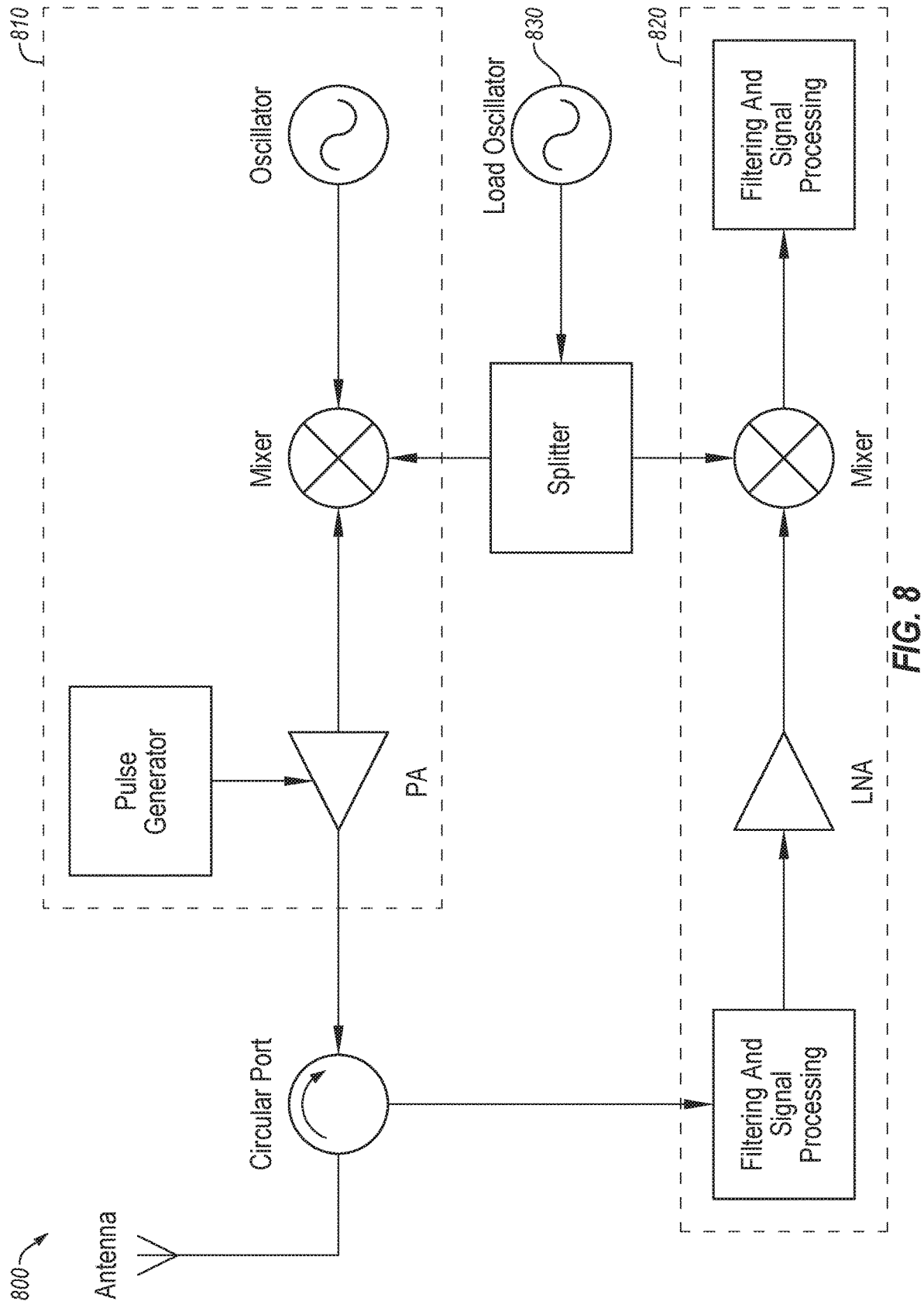
FIG. 8 is a block diagram of a transceiver that includes a local oscillator circuit that is temperature compensated, according to an embodiment of the disclosure.

FIG. 8 shows one example application, which is in a local oscillator circuit that is used with a transceiver. FIG. 8 shows transceiver 800, which includes a transmitter path 810, a receiver path 820, and a local oscillator (LO) 830. The LO 830 may incorporate frequency compensation or compensation and calibration according to embodiments of the disclosure. In one embodiment, the LO 830 may be configured to provide oscillator up-conversion during transmission of signals and oscillator down-conversion during reception of signals, of the transceiver 800, according to one or more protocols, and across one or more frequency spectrums.

While certain embodiments have been described with reference to a crystal oscillator, embodiments of the disclosure may address frequency variation due to temperature for any piezoelectric resonator, including crystal oscillators such as quartz crystal or ceramic.

While embodiments have been described with reference to a phase detector output that may be configured to output a voltage, the disclosure is not so limited and a phase detector output may be operatively coupled to a current source, such as a charge pump.

Figure 9:
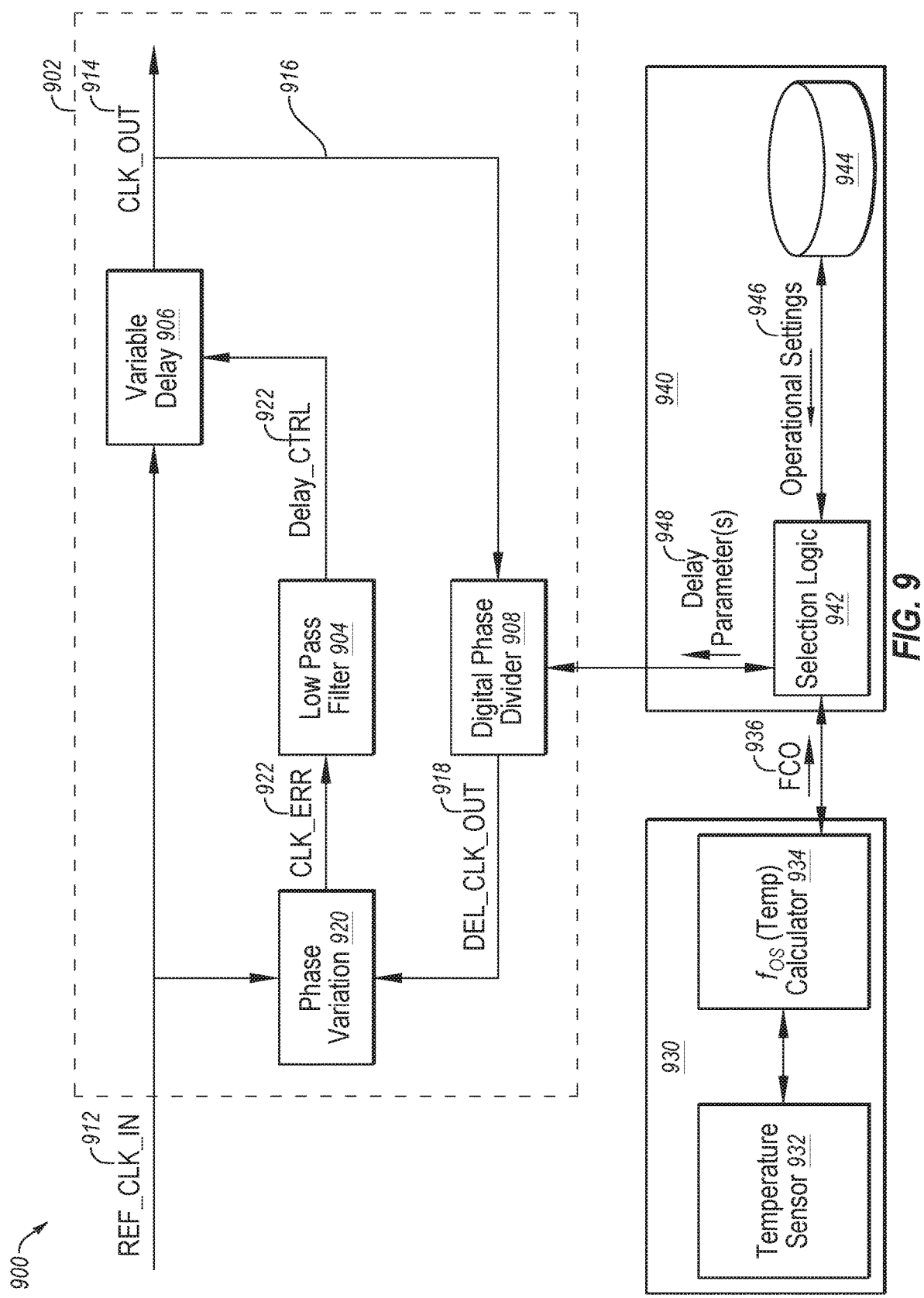
FIG. 9 is a block diagram of a delay-locked-loop including frequency variation compensation, according to an embodiment of the disclosure.

While embodiments of the disclosure have been described in terms of PLLs, one of ordinary skill in the art will understand that the embodiments of the disclosure are also applicable to delay-lock-loops (DLLs). FIG. 9 shows a system 900 with a temperature compensated DLL configured to provide a system clock signal 914 (CLK_OUT), in accordance with one or more embodiments of the disclosure. System clock signal 914 may be a digital clock signal (e.g., a signal having a periodic waveform) and may be provided to feedback variable delay 906 bay way of feedback path 916. Digital phase divider 908 may be configured to receive system clock signal 914 and provide delayed feedback signal 918 (DEL_CLK_OUT). Phase variation 910 may be configured to receive delayed feedback signal 918 and reference clock signal 912 (REF_CLK_IN) and provide an error signal 920 (CLK_ERR) that is indicative of a phase difference between delayed feedback signal 918 and reference clock signal 912. Low-pass filter 904 may be configured to receive error signal 920 (CLK_ERR) and provide a low-pass filtered signal that may be a delay control signal 922 (DELAY_CTRL) configured for controlling variable feedback delay 906. In one embodiment, low-pass filter 904 may be an integrator that provides a magnitude response which is the reciprocal of the frequency of the error signal 920. Variable feedback delay 906 may be configured to receive delay control signal 922 and provide system clock signal 914. In one embodiment, variable feedback delay 906 may include small delay elements (e.g., inverters), and a number of delay elements may be activated responsive to delay control signal 922. In other words, the number of delay elements may be indicative of the magnitude the degree to which delayed feedback signal 918 and reference clock signal 912 are out of phase.

In one embodiment, digital phase divider 908 may be configured to divide a square wave and output a signal out of phase with the divided square wave. Digital phase divider 908 may be configured to divide the system clock signal 914 responsive to delay parameters 948. Selection logic 942 may be configured to determine a delay parameters 948 responsive to a frequency offset compensation 936. Compensation circuitry 930 may be configured to provide the frequency offset compensation 936, and may include a calculator 934 and temperature sensor 932. The temperature sensor 932 may provide measurements of the temperature of the source of the reference clock signal 912, and the calculator 934 may be configured to determine a frequency offset compensation 936 responsive to the temperature measurements. The calculator 934 may determine the frequency offset compensation 936 responsive to temperature versus frequency characteristic information about the source of the reference clock signal 912. In one embodiment, the error characteristic may be expressed as a frequency error, a phase error, an amplitude error, or the like.

Calibration of the system of FIG. 9 for frequency error due to temperature may be also be performed according to the techniques of this disclosure.

One or more embodiments of the disclosure may relate, generally, to a clock tracking loop circuitry. In one embodiment, the clock tracking loop circuitry may be configured to synchronize to a reference signal or to one or more multiples of a reference signal. In one embodiment the clock tracking loop circuitry may include phase variation control, and in another embodiment frequency variation control.

One of ordinary skill in the art will recognize that DLLs that implement temperature compensation techniques of this disclosure have many useful applications. For example, clock de-skewing in applications with wide temperature variation, multiphase clock generation, and clock/data recover systems.

One of ordinary skill in the art would recognize that the compensation and/or control circuitry shown in FIG. 2, and the compensation, control, and/or calibration circuitry shown in FIG. 4 may also be used with other electronic device architectures. For example, a frequency synthesizer that includes a reference frequency divider between the output of the crystal oscillator and the input of a phase detector and counters that configure the reference and program frequency dividers. Compensation circuitry may be added to configure either or both of the frequency dividers to reduce frequency variation due to temperature.

Any characterization in this disclosure of something as "typical," "conventional," or "known" does not necessarily mean that it is disclosed in the prior art or that the discussed aspects are appreciated in the prior art. Nor does it necessarily mean that, in the relevant field, it is widely known, well-understood, or routinely used.

Additional non-limiting embodiments of the disclosure may include:

Embodiment 1: A method of configuring a clock-tracking-loop (CTL) for operation across a wide temperature range, the method comprising: receiving one or more temperature measurements associated with a crystal oscillator providing a reference signal to a clock-tracking-loop (CTL); and configuring the CTL to adjust an output signal of the CTL responsive to the one or more temperature measurements and one or more frequency error characteristics associated with the crystal oscillator.

Embodiment 2: The method of Embodiment 1, further comprising: determining a frequency offset compensation responsive to at least one temperature measurement of the one or more temperature measurements and at least one frequency error characteristic of the one or more frequency error characteristics; and determining at least one device parameter associated with the CTL responsive to the frequency offset compensation and one or more operational settings associated with the CTL.

Embodiment 3: The method of Embodiments 1 and 2, further comprising: adjusting at least one operational setting of the one or more operational settings responsive to the frequency offset compensation; and determining a device parameter for configuring the CTL responsive to the adjusted at least one operational setting.

Embodiment 4: The method of Embodiments 1 through 3, further comprising selecting the at least one frequency error characteristic responsive to a curve fit function that defines a frequency error characteristic versus temperature.

Embodiment 5: The method of Embodiments 1 through 4, further comprising: searching a look-up-table for one or more temperature entries that match the at least one temperature measurement; providing the at least one frequency error characteristic responsive to the search; and taking an inverse of the at least one frequency characteristics.

Embodiment 6: The method of Embodiments 1 through 5, further comprising: searching a look-up-table for one or more temperature entries and one or more frequencies that match the at least one temperature measurement and the at least one operational setting, wherein the at least one operational setting corresponds to one or more frequencies of interest; providing the at least one frequency error characteristic responsive to the search; and taking an inverse of the at least one frequency characteristics.

Embodiment 7: The method of Embodiments 1 through 6, further comprising: adjusting a frequency of a feedback signal of the CTL responsive to the at least one device parameter, wherein the feedback signal corresponds to a first frequency of the output signal of the CTL; generating a phase error signal responsive to the adjusted feedback signal and the reference signal supplied by the crystal oscillator; and providing the adjusted output signal responsive to the phase error signal, wherein the adjusted output signal has a second frequency.

Embodiment 8: The method of Embodiments 1 through 7, wherein the CTL is a phase-locked-loop and adjusting the frequency of the feedback signal comprises frequency dividing the feedback signal responsive to the device parameter.

Embodiment 9: The method of Embodiments 1 through 8, wherein the CTL is a delay-locked-loop and adjusting the frequency of the feedback signal comprises phase dividing the feedback signal responsive to the device parameter.

Embodiment 10: The method of Embodiments 1 through 9, further comprising calibrating the CTL for frequency variation for an expected use at room temperature.

Embodiment 11: The method of Embodiments 1 through 10, wherein calibrating the CTL for frequency variation for an expected use at room temperature comprises: controlling the CTL to generate a test output signal having a test frequency responsive to a test device parameter, wherein the test device parameter is associated with a known output signal having a known frequency; detecting a difference between test frequency of the test output signal and the known frequency of the known output signal; updating one or more setting associated with the CTL responsive to the detected difference.

Embodiment 12: The method of Embodiments 1 through 11, wherein the one or more settings are one or more operational settings used by a controller to configure the CTL to operate in one or more applications.

Embodiment 13: A control system for a clock-tracking-loop, the system comprising: a temperature sensor configured to provide one or more temperature measurements associated with a crystal oscillator; an error compensation circuitry configured to determine one or more frequency error characteristics of the crystal oscillator responsive to the one or more temperature measurements; and a control circuitry configured to program a clock-tracking-loop (CTL) to adjust an output signal of the CTL responsive to the one or more frequency error characteristics associated with the crystal oscillator.

Embodiment 14: The control system of Embodiment 13, wherein the error compensation circuitry is configured to determine a frequency offset compensation responsive to: at least one temperature measurement of the one or more temperature measurements; and at least one frequency error characteristic of the one or more frequency error characteristics.

Embodiment 15: The control system of Embodiments 13 and 14, wherein the error compensation circuitry is configured to select the at least one frequency error characteristic responsive to a curve fit function that defines a frequency error characteristic versus temperature.

Embodiment 16: The control system of Embodiment 13 through 15, wherein the error compensation circuitry is configured to: search a look-up-table for one or more temperature entries that match the at least one temperature measurement; provide the at least one frequency error characteristic responsive to the search; and take an inverse of the at least one frequency characteristics.

Embodiment 17: The control system of Embodiments 13 through 16, wherein the error compensation circuitry is configured to: search a look-up-table for one or more temperature entries and one or more frequencies that match the at least one temperature measurement and the at least one operational setting, wherein the at least one operational setting corresponds to one or more frequencies of interest; provide the at least one frequency error characteristic responsive to the search; and take an inverse of the at least one frequency characteristics.

Embodiment 18: The control system of Embodiments 13 through 17, wherein the control circuitry is configured to determine at least one device parameter associated with the CTL responsive to the frequency offset compensation and one or more operational settings associated with the CTL.

Embodiment 19: The control system of Embodiments 13 through 18, wherein the control circuitry is configured to: adjust at least one operational setting of the one or more operational settings responsive to the frequency offset compensation; and determine a device parameter for configuring the CTL responsive to the adjusted at least one operational setting.

Embodiment 20: The control system of Embodiments 13 through 19, further comprising calibration circuitry configured to calibrate the CTL for frequency variation for an expected use at room temperature.

Embodiment 21: The control system of Embodiments 13 through 20, wherein the calibration circuitry is configured to calibrate the CTL for frequency variation for an expected use at room temperature by: controlling the CTL to generate a test output signal having a test frequency responsive to a test device parameter, wherein the test device parameter is associated with a known output signal having a known frequency; detecting a difference between test frequency of the test output signal and the known frequency of the known output signal; updating one or more setting associated with the CTL responsive to the detected difference.

Embodiment 22: The control system of Embodiments 13 through 21, wherein the one or more settings are one or more operational settings used by a controller to configure the CTL to operate in one or more applications.

Embodiment 23: A clock-tracking-loop system, comprising: a clock-tracking-loop (CTL) configured to provide an output signal that tracks to a reference signal provided by a crystal oscillator responsive to one or more device settings; and a control circuitry configured to provide one or more device settings to the CTL, the control circuitry comprising: a temperature sensor configured to provide one or more temperature measurements associated with a crystal oscillator; an error compensation circuitry configured to determine one or more frequency error characteristics of the crystal oscillator responsive to the one or more temperature measurements; and a control circuitry configured to program a clock-tracking-loop (CTL) to adjust an output signal of the CTL responsive to the one or more frequency error characteristics associated with the crystal oscillator, and wherein the CTL is configured to provide the output signal that tracks to the reference signal by: adjusting a frequency of a feedback signal of the CTL responsive to the at least one device parameter, wherein the feedback signal corresponds to a first frequency of the output signal of the CTL; generating a phase error signal responsive to the adjusted feedback signal and the reference signal supplied by the crystal oscillator; and providing the adjusted output signal responsive to the phase error signal, wherein the adjusted output signal has a second frequency.

Embodiment 24: The clock-tracking-loop system of Embodiment 23, wherein the CTL is a phase-locked-loop and adjusting the frequency of the feedback signal comprises frequency dividing the feedback signal responsive to the device parameter.

Embodiment 25: The clock-tracking-loop system of Embodiments 23 and 24, wherein the CTL is a delay-locked-loop and adjusting the frequency of the feedback signal comprises phase dividing the feedback signal responsive to the device parameter.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method of configuring a clock-tracking-loop (CTL) for operation across a wide temperature range, the method comprising:
receiving one or more temperature measurements associated with a crystal oscillator providing a reference signal to—the CTL—;
selecting one of a number of pre-calibrated operational settings of the CTL, the number of precalibrated operational settings pre-calibrated responsive to one or more temperatures and one or more frequency error characteristics associated with the crystal oscillator; and configuring the CTL to adjust an output signal of the CTL responsive to the selected pre-calibrated operational setting and the one or more temperature measurements.

2. The method of claim 1, further comprising:

determining a frequency offset compensation responsive to at least one temperature measurement of the one or more temperature measurements and at least one frequency error characteristic of the one or more frequency error characteristics; and determining at least one device parameter associated with the CTL responsive to the frequency offset compensation and one or more operational settings associated with the CTL.

3. The method of claim 2, further comprising:

adjusting at least one operational setting of the one or more operational settings responsive to the frequency offset compensation; and determining a device parameter for configuring the CTL responsive to the adjusted at least one operational setting.

4. The method of claim 3, further comprising selecting the at least one frequency error characteristic responsive to a curve fit function that defines a frequency error characteristic versus temperature.

5. The method of claim 3, further comprising:

searching a look-up-table for one or more temperature entries that match the at least one temperature measurement;

providing the at least one frequency error characteristic responsive to the search; and taking an inverse of the at least one frequency error characteristic.

6. The method of claim 3, further comprising:

searching a look-up-table for one or more temperature entries and one or more frequencies that match the at least one temperature measurement and the at least one operational setting, wherein the at least one operational setting corresponds to one or more frequencies of interest;

providing the at least one frequency error characteristic responsive to the search; and taking an inverse of the at least one frequency error characteristic.

7. The method of claim 2, further comprising:

adjusting a frequency of a feedback signal of the CTL responsive to the at least one device parameter, wherein the feedback signal corresponds to a first frequency of the output signal of the CTL;

generating a phase error signal responsive to the adjusted frequency of the feedback signal and the reference signal supplied by the crystal oscillator; and providing the adjusted output signal responsive to the phase error signal, wherein the adjusted output signal has a second frequency.

8. The method of claim 7, wherein the CTL is a phase-locked-loop and adjusting the frequency of the feedback signal comprises frequency dividing the feedback signal responsive to the device parameter.

9. The method of claim 7, wherein the CTL is a delay-locked-loop and adjusting the frequency of the feedback signal comprises phase dividing the feedback signal responsive to the device parameter.

10. The method of claim 1, further comprising calibrating the CTL for frequency variation for an expected use at room temperature.

11. The method of claim 10, wherein calibrating the CTL for frequency variation for an expected use at room temperature comprises:

controlling the CTL to generate a test output signal having a test frequency responsive to a test device parameter, wherein the test device parameter is associated with a known output signal having a known frequency;

detecting a difference between test frequency of the test output signal and the known frequency of the known output signal; and updating one or more settings associated with the CTL responsive to the detected difference.

12. The method of claim 11, wherein the one or more settings are one or more operational settings used by a controller to configure the CTL to operate in one or more applications.

13. A control system for a clock-tracking-loop—(CTL)—, the control system comprising:

a temperature sensor configured to provide one or more temperature measurements associated with a crystal oscillator;

an error compensation circuitry configured to select one of a number of pre-calibrated operational settings of— the CTL—, the number of pre-calibrated operational settings pre-calibrated responsive to one or more temperatures and one or more determined frequency error characteristics of the crystal; and a control circuitry configured to program the CTL to adjust an output signal of the CTL responsive to the selected pre-calibrated operational setting and the one or more temperature measurements.

14. The control system of claim 13, wherein the error compensation circuitry is configured to determine a frequency offset compensation responsive to:

at least one temperature measurement of the one or more temperature measurements; and at least one frequency error characteristic of the one or more determined frequency error characteristics.

15. The control system of claim 14, wherein the error compensation circuitry is configured to select the at least one frequency error characteristic responsive to a curve fit function that defines a frequency error characteristic versus temperature.

16. The control system of claim 14, wherein the error compensation circuitry is configured to:

search a look-up-table for one or more temperature entries that match the at least one temperature measurement;

provide the at least one frequency error characteristic responsive to the search; and take an inverse of the at least one frequency error characteristic.

17. The control system of claim 14, wherein the error compensation circuitry is configured to:

search a look-up-table for one or more temperature entries and one or more frequencies that match the at least one temperature measurement and at least one operational setting, wherein the at least one operational setting corresponds to one or more frequencies of interest;

provide the at least one frequency error characteristic responsive to the search; and take an inverse of the at least one frequency error characteristic.

18. The control system of claim 14, wherein the control circuitry is configured to determine at least one device parameter associated with the CTL responsive to the frequency offset compensation and one or more operational settings associated with the CTL.

19. The control system of claim 18, wherein the control circuitry is configured to:
  adjust at least one operational setting of the one or more operational settings responsive to the frequency offset compensation; and
  determine a device parameter for configuring the CTL responsive to the adjusted at least one operational setting.

20. The control system of claim 13, further comprising calibration circuitry configured to calibrate the CTL for frequency variation for an expected use at room temperature.

21. The control system of claim 20, wherein the calibration circuitry is configured to calibrate the CTL for frequency variation for an expected use at room temperature by:
  controlling the CTL to generate a test output signal having a test frequency responsive to a test device parameter, wherein the test device parameter is associated with a known output signal having a known frequency;
  detecting a difference between test frequency of the test output signal and the known frequency of the known output signal; and
  updating one or more settings associated with the CTL responsive to the detected difference.

22. The control system of claim 21, wherein the one or more settings are one or more operational settings used by a controller to configure the CTL to operate in one or more applications.

23. A clock-tracking-loop system, comprising:
  a clock-tracking-loop (CTL) configured to provide an output signal that tracks to a reference signal provided by a crystal oscillator responsive to one or more device settings; and
  a control circuitry configured to provide one or more device settings to the CTL, the control circuitry comprising:
    a temperature sensor configured to provide one or more temperature measurements associated with a crystal oscillator;
    an error compensation circuitry configured to select one of a number of pre-calibrated operational settings of the CTL, the number of pre-calibrated operational settings pre-calibrated responsive to one or more temperatures and one or more determined frequency error characteristics of the crystal oscillator; and
    a control circuitry configured to program the CTL to adjust an output signal of the CTL responsive to the selected pre-calibrated operational setting and the one or more temperature measurements, and
  wherein the CTL is configured to provide the output signal that tracks to the reference signal by:
    adjusting a frequency of a feedback signal of the CTL responsive to at least one device parameter, wherein the feedback signal corresponds to a first frequency of the output signal of the CTL;
    generating a phase error signal responsive to the adjusted frequency of the feedback signal and the reference signal supplied by the crystal oscillator; and
    providing the adjusted output signal responsive to the phase error signal, wherein the adjusted output signal has a second frequency.

24. The clock-tracking-loop system of claim 23, wherein the CTL is a phase-locked-loop and adjusting the frequency of the feedback signal comprises frequency dividing the feedback signal responsive to the at least one device parameter.

25. The clock-tracking-loop system of claim 23, wherein the CTL is a delay-locked-loop and adjusting the frequency of the feedback signal comprises phase dividing the feedback signal responsive to the at least one device parameter.

* * * * *

UNITED STATES PATENT AND TRADEMARK OFFICE
CERTIFICATE OF CORRECTION

PATENT NO. : 10,985,762 B2
APPLICATION NO. : 16/240357
DATED : April 20, 2021
INVENTOR(S) : Arnel Tagatac Page 1 of 1

It is certified that error appears in the above-identified patent and that said Letters Patent is hereby corrected as shown below:

In the Specification

Column 1, Line 65, insert --The purpose and advantages of the embodiments of the disclosure will be apparent to one of ordinary skill in the art from the summary in conjunction with the detailed description and appended drawings that follow. The patent or application file contains at least one drawing executed in color. Copies of this patent or patent application publication with color drawing(s) will be provided by the Office upon request and payment of the necessary fee.--

In the Claims

| Claim 1, | Column 16, | Line 64, | change "—the CTL—" to --the CTL-- |
| Claim 13, | Column 18, | Line 17, | change "—(CTL)—" to --(CTL)-- |
| Claim 13, | Column 18, | Line 23-24, | change "—the CTL—" to --the CTL-- |

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*